US006447608B1

(12) United States Patent
Sakai et al.

(10) Patent No.: US 6,447,608 B1
(45) Date of Patent: Sep. 10, 2002

(54) SPIN COATING APPARATUS

(75) Inventors: Mitsuhiro Sakai, Koshimachi; Hideyuki Takamori, Kumamoto; Masafumi Nomura, Koshimachi, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/675,178

(22) Filed: Sep. 29, 2000

Related U.S. Application Data

(63) Continuation of application No. 09/182,414, filed on Oct. 30, 1998, now Pat. No. 6,159,541.

(30) Foreign Application Priority Data

Oct. 31, 1997 (JP) .............................. 9-314632
Nov. 18, 1997 (JP) .............................. 9-332290

(51) Int. Cl.[7] ............................ B05C 13/02; B05D 3/12
(52) U.S. Cl. ..................... 118/52; 118/320; 427/240; 427/425
(58) Field of Search ................. 118/52, 319, 320; 427/240, 425

(56) References Cited

U.S. PATENT DOCUMENTS 5,608,943 A * 3/1997 Konishi et al. ............... 15/302
5,688,322 A   11/1997 Motoda et al.
5,718,763 A    2/1998 Tateyama et al.
5,762,709 A *  6/1998 Sugimoto et al. ............ 118/52
5,908,657 A *  6/1999 Kimura et al. ................ 427/9
5,962,193 A * 10/1999 Lin et al. .................... 430/311

FOREIGN PATENT DOCUMENTS

JP    3-186379    8/1991
JP    4-107812    4/1992

* cited by examiner

Primary Examiner—Richard Crispino
Assistant Examiner—Kevin P. Shortsle
(74) Attorney, Agent, or Firm—Oblon, Spivak, McClelland, Maier & Neustadt, P.C.

(57) ABSTRACT

A coating process comprises the steps of (a) holding a-substrate using a spin chuck surrounded by inner and outer cups, such that the substrate can rotate, (b) rotating the substrate by rotating the spin chuck, and applying a coating liquid onto the substrate, thereby forming a coating on the substrate, (c) discharging, from the inner and outer cups, that part of the coating liquid which is scattered from the substrate while the substrate is rotated, (d) exhausting the inner and outer cups through a plurality of exhaust ports formed in outer peripheral portions of the outer cup, and (e) reducing, from a peripheral region of the substrate, the mist of the coating liquid which has occurred during the step (b), before the substrate stops rotation.

10 Claims, 13 Drawing Sheets

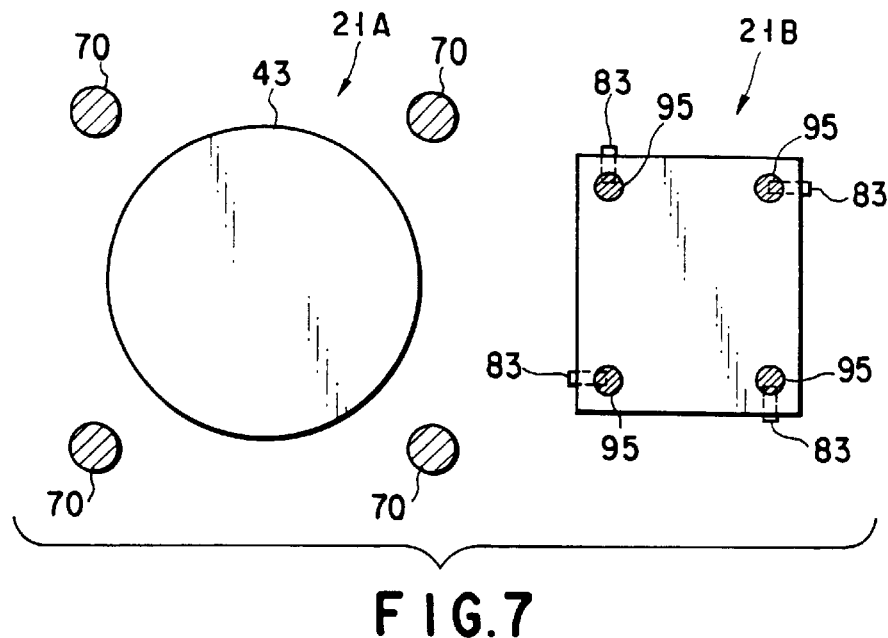
FIG.7
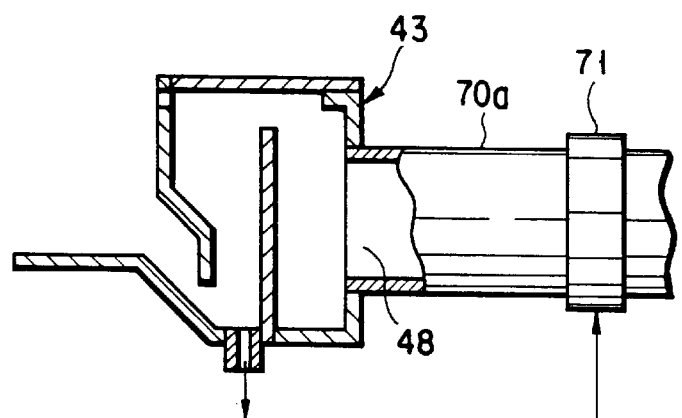
FIG.8
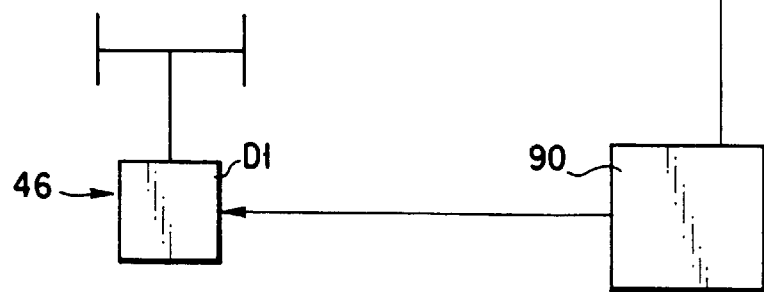

SPIN COATING APPARATUS

This application is a Continuation of application Ser. No. 09/182,414 Filed on Oct. 30, 1998 now U.S. Pat. No. 6,159,541.

BACKGROUND OF THE INVENTION

This invention relates to a coating process for applying a coating liquid to a substrate such as a glass substrate for a liquid crystal display (LCD), thereby forming a coating film such as a photoresist coating or an anti-reflective coating.

The LCD manufacturing process employs photolithography as the manufacturing process of a semiconductor device. In the photolithography for the LCD, a resist coating is formed on a glass substrate, and subjected to pattern exposure and then development. A semiconductor layer, an insulating layer and an electrode layer formed on the substrate are selectively etched, thereby forming an ITO (Indium Tin Oxide) thin film or electrode pattern, etc.

To coat the LCD substrate with a resist liquid, so-called spin coating is used. The spin coating is performed using a coating apparatus as disclosed in U.S. Pat. No. 5,688,322. In this coating apparatus, an LCD substrate is held by a spin chuck, a solvent and a resist liquid are dripped onto the substrate, and the spin chuck and a rotary cup are rotated in synchronism with each other, with the upper opening of the cup closed with a lid. Liquid drips or mist scattering from the substrate are received by a drain cup, thereby exhausting liquid components in the form of, for example, droplets to the outside of the cup through a plurality of liquid exhaust pipes, and gaseous components in the form of, for example, mist to the outside of the cup through a plurality of gas exhaust pipes.

Since each gas exhaust pipe opens to the periphery of the drain cup, that part of the mist which exists in the vicinity of the openings (exhaust ports.) of the exhaust pipes is first exhausted, and thereafter the exhaust area gradually increases within the cup. Therefore, it is difficult to promptly exhaust the entire internal area of the cup.

The size of LCD substrates has recently increased from (650×550 mm) to (830×650 mm). If the substrate size more and more increases in near future, coating the substrate with a resist liquid will cause generation of a great amount of mist which may contaminate the resist coating. Since in particular, it is difficult to perform complete exhaustion after the rotation of the substrate is stopped, the resist coating is more likely to be contaminated by the mist. A great amount of mist is hard to sufficiently separate into a gas and a liquid in the drain cup, and hence a gas/liquid mixture will be exhausted through the gas exhaust pipes. This means that a great amount of mist will enter the gas exhaust pipes.

BRIEF SUMMARY OF THE INVENTION

It is the object of the invention to provide a coating process which are free from contamination of a coating on a substrate by mist of a coating liquid.

The inventors have found that if the amount of exhaustion within the cup is simply increased, the influence of gas flow due to exhaustion will increase, which makes it difficult to form a uniform resist coating on an LCD substrate, and which increases the range of variations in the thickness of the resist coating, particularly in the case of a large LCD substrate. In light of this, the inventors have developed an invention as described below, as a result of deep and serious research.

According to an aspect of the invention, there is provided a process of forming a coating on a substrate within a cup section which has an upper opening and an exhaust port, comprising the steps of: (a) carrying a substrate into the cup section through the upper opening, and holding the substrate by a spin chuck; (b) applying a coating liquid to the substrate while exhausting the cup section through the exhaust port; (c) rotating the spin chuck and the substrate while exhausting the cup section through the exhaust port, thereby diffusing the coating liquid applied to the substrate in the step (b) to form a coating on the substrate; (d) stopping the rotation of the substrate and carrying the substrate with the coating out of the cup section; and (e) changing, during the step (c) or (d), the amount of exhaustion of the cup section to a value greater than a greater one of the amounts of exhaustion assumed in the steps (b) and (c), in order to exhaust, from the cup section, a mist of the coating liquid which occurs during the step (c).

The cup section includes an inner cup which surrounds the substrate, and an outer cup which surrounds the inner cup, communicates with the inner cup and the exhaust port, and has a gas/liquid separating member; and in the step (e), an excreta which contains a mist of the coating liquid exhausted from the inner cup is separated into a liquid component and a gas component by the gas/liquid separating member, and the mist of the coating liquid is exhausted through the exhaust port.

It is preferable that in the step (c), the lid is mounted on the cup section to close the upper opening, and the substrate is raised to approach the lid such that it is opposed to the lid at a level higher than the exhaust port.

It is also preferable that in the step (e) to raise the substrate while the lid is raised. In this case, it is preferable that the raising speed of the substrate is higher than the raising speed of the lid.

Further preferably, in the steps (b), (c) and (e), exhaustion of the cup section is performed through the exhaust port in a direction opposite to the direction of rotation of the substrate, and in a circumferential direction.

According to another aspect of the invention, there is provided a process of forming a coating on a substrate within a cup section which has an upper opening and an exhaust port, comprising the steps of: (a) carrying a substrate into the cup section through the upper opening, and holding the substrate by a spin chuck; (b) applying a coating liquid to the substrate while exhausting the cup section through the exhaust port; (c) rotating the spin chuck and the substrate while exhausting the cup section through the exhaust port, thereby diffusing the coating liquid applied to the substrate in the step (b) to form a coating on the substrate; (d) stopping the rotation of the substrate and carrying the substrate with the coating out of the cup section; and (h) raising the substrate to a level higher than the exhaust port while rotating the substrate in the step (c).

In the step (h), it is preferable that the substrate is raised while the lid is raised. In this case, it is also preferable that the raising speed of the substrate is higher than the raising speed of the lid. It is further preferable that the substrate is made to approach the lid to define therebetween a narrow clearance. In addition, it is desirable that during the step (c) or (d), the amount of exhaustion of the cup section should be changed to a value greater than a greater one of the amounts of exhaustion assumed in the steps (b) and (c), in order to exhaust, from the cup section, a mist of the coating liquid which occurs during the step (c).

Furthermore, a mist of the coating liquid may be introduced through the exhaust port into an exhaustion passage in a direction opposite to the direction of rotation of the substrate. In this case, it is desirable that a plurality of exhaust ports should be arranged symmetrical with respect to the center of rotation of the substrate, and that the diameter of each exhaust port viewed along the axis of the outer cup should be smaller than the diameter thereof viewed along the circumference of the outer cup.

Since in the invention, the exhaust port is connected to the gas exhaust pipe such that the direction of flow of a fluid (mist) from the exhaust port to the exhaust pipe is opposite to the direction of rotation of the substrate, it is hard for mist to directly enter the gas exhaust pipe. In addition, since in the invention, the gas exhaust pipe is connected to a lower portion of the outer peripheral wall of the outer cup to thereby define a zigzag passage together with the gas/liquid separating member, mist is prevented from directly entering the gas exhaust pipe, thereby further promoting gas/liquid separation of the mist.

Also, since the gas exhaust port is constructed such that a diameter thereof when viewed in a radial direction of the outer cup is greater than a diameter thereof when viewed in an axial direction of the outer cup, the open area of each gas exhaust port with respect to the outer cup (drain cup) is large, and hence exhaustion of mist from the outer cup can be performed smoothly. As a result, the atmosphere around the substrate can be promptly cleaned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a plan view, useful in explaining a unit exhaust pipe incorporated in a coating section and a peripheral-coating-removing section;

FIG. 8 is a block diagram, showing a controller for an exhaust system and a rotary driving system incorporated in the coating section;

DETAILED DESCRIPTION OF THE INVENTION

Preferred embodiments of the invention will be described with reference to the accompanying drawings.

Figure 1:
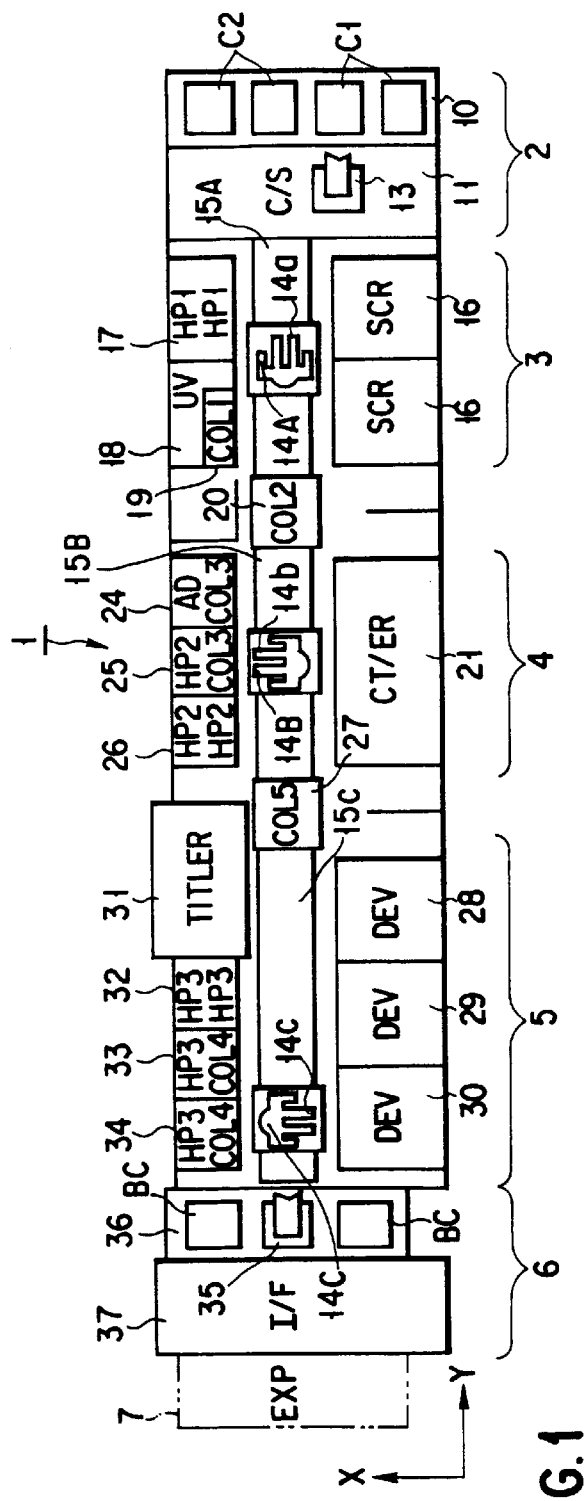
FIG. 1 is a schematic plan view, showing an LCD substrate treatment system.
Figure 2:
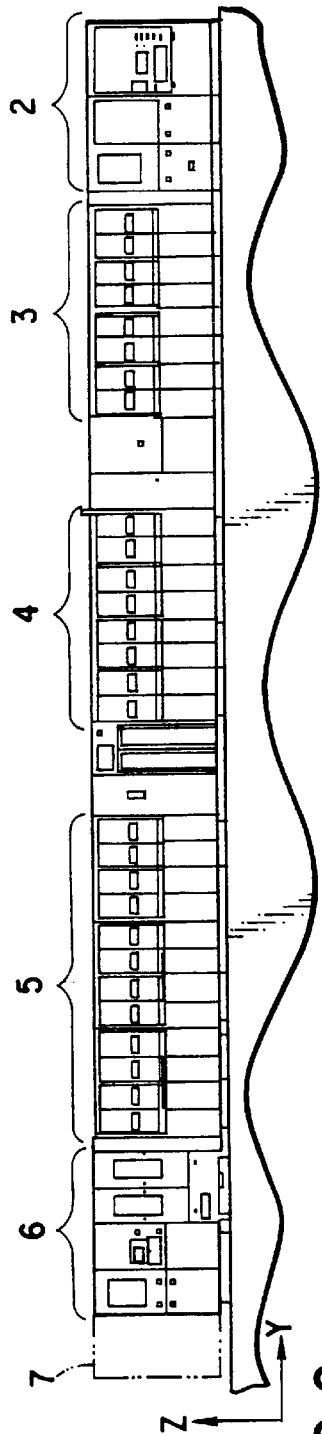
FIG. 2 is a schematic front view, showing an outward appearance of the LCD substrate treatment system.

As is shown in FIGS. 1 and 2, a coating/developing process system 1 has a loader/unloader section 2, a first treatment section 3, a second treatment section 4, a third treatment section 5 and an interface section 6. The process system 1 thus includes various treatment mechanisms for coating an LCD substrate G with a photoresist liquid and developing a resist coating film, and is connected to an exposure unit 7 via the interface section 6.

The loader/unloader section 2 has a cassette table 10 and a transfer section 11 which extend in the X-direction. Cassettes C1 and C2, four cassettes at maximum, are arranged in line on the cassette table 10. The two cassettes C1 contain LCD substrates G as yet untreated, while the other two cassettes C2 contain treated LCD cassettes G. Each cassette C1, C2 can contain 25 LCD substrates G at maximum.

The transfer section 11 of the loader/unloader section 2 is provided with a first sub arm mechanism 13. The sub arm mechanism 13 has a holder for transferring each substrate G to and from the cassettes C1 and C2, an advancing/retreating mechanism for advancing and retreating the holder, an X-axis driving mechanism for moving the holder in the X-axis direction, a Z-axis driving mechanism for moving the holder in the Z-axis direction, and a θ-rotation driving mechanism for rotating the holder about the Z-axis.

The first treatment section 3 includes a center transfer passage 15A extending in the Y-axis direction, a first main arm mechanism 14A movable along the transfer passage 15A, and a plurality of treatment units 16–19. Two wet-type cleaning units 16 are provided on one side of the transfer passage 15A. Each unit 16 has a brush scrubber SCR for cleaning the surface of each substrate G by scrubbing with a rotary brush while applying thereto a cleaning liquid. A heating unit 17, a dry-type cleaning unit 18 and a cooling unit 19 are provided on the other side of the transfer passage 15A. The heating unit 17 has a hot plate HP1 of two (upper and lower) stages. The dry-type cleaning unit 18 has an ultraviolet cleaning unit UV for radiating the substrate G with ultraviolet ray to clean it. The cooling unit 19 has a cooling plate COL1 for cooling the substrate G. The first main arm mechanism 14A has a holder 14a for holding the substrate G, an advancing/retreating mechanism for advancing and retreating the holder 14a, an X-axis driving mechanism for moving the holder 14a in the X-axis direction, a Z-axis driving mechanism for moving the holder 14a in the Z-axis direction, and a θ-rotation driving mechanism for rotating the holder 14a about the Z-axis.

The second treatment section 4 includes a center transfer passage 15B extending in the Y-axis direction, a second main arm mechanism 14B movable along the transfer passage 15B, and a plurality of treatment units 21–26. A resist-coating/peripheral-resist-removing unit 21 is provided on one side of the transfer passage 15B. The unit 21 has a coating unit CT for coating the substrate G with a resist liquid while rotating the substrate, and a peripheral-resist-removing unit ER for removing a resist film from an edge portion of the substrate G. An adhesion/cooling unit 24, a heating/cooling unit 25 and a heating/heating unit 26 are provided on the other side of the transfer passage 15B. The adhesion/cooling unit 24 includes an adhesion unit AD for treating the surface of the substrate G with HMDS vapor to impart to it a hydrophobic property, and a cooling plate COL3 for cooling the substrate G. The heating/cooling unit 25 includes a hot plate HP2 for heating the substrate G, and a cooling plate COL3 for cooling the substrate G. The heating/heating unit 26 has a hot plate HP2 of two (upper and lower) stages for heating the substrate G.

The third treatment section 5 includes a center transfer passage 15C extending in the Y-axis direction, a third main arm mechanism 14C movable along the transfer passage 15C, and a plurality of treatment units 28–34. Developing units 28–30 are provided on one side of the transfer passage 15B. Each developing unit has a developing device DEV for developing a resist coating using a developer. A titler 31, a heating/heating unit 32 and heating/cooling units 33 and 34 are provided on the other side of the transfer passage 15B. The second and third main arm mechanisms 14B and 14C have substantially the same structure as the first main arm mechanism 14A. Further, a cooling unit 20 is interposed between the first and second treatment sections 3 and 4, and a cooling unit 27 between the second and third treatment sections 4 and 5. The cooling units 20 and 27 are also used to temporarily make a to-be-treated substrate G in a standby state.

The interface section 6 is provided between the third treatment section 5 and the exposure unit 7, and includes a transfer/standby section 36 and a delivery section 37. The transfer/standby section 36 has a second sub arm mechanism 35 and two buffer cassettes BC. The second sub arm mechanism 35 has substantially the same structure as the first sub arm mechanism 13. Each buffer cassette BC accommodates to-be-treated substrates G temporarily kept standby. The delivery section 37 has a delivery table (not shown) for transferring each substrate G between the transfer mechanism (not shown) of the exposure unit 7 and the second sub arm mechanism 35.

Referring then to FIGS. 3–7, the resist-coating/peripheral-resist-removing unit 21 will be described.

Figure 3:
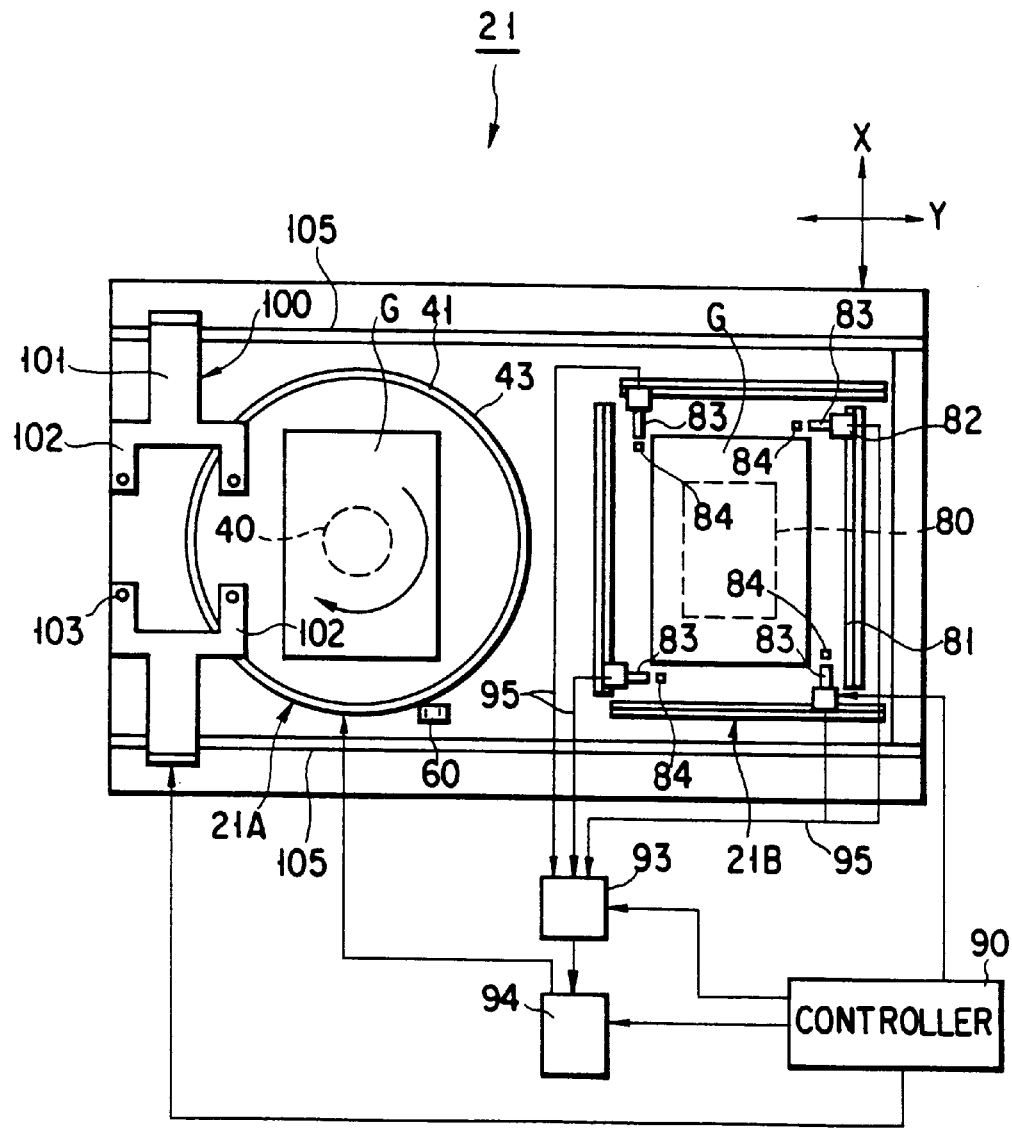
FIG. 3 is a schematic plan block diagram, showing a coating/peripheral-coating-removing unit.

As is shown in FIG. 3, the unit 21 includes a resist coating section 21A (CT) and a peripheral-resist-removing section 21B (ER). The unit 21 has two openable/closable ports (not shown) formed in a front wall thereof. The substrate G is transferred into the resist coating section 21A through one of the ports, and out of the peripheral-resist-removing section 21B through the other port. The unit 21 also has a conveying mechanism 100 for moving the substrate G from the resist coating section 21A to the peripheral-resist-removing section 21B.

Figure 4:
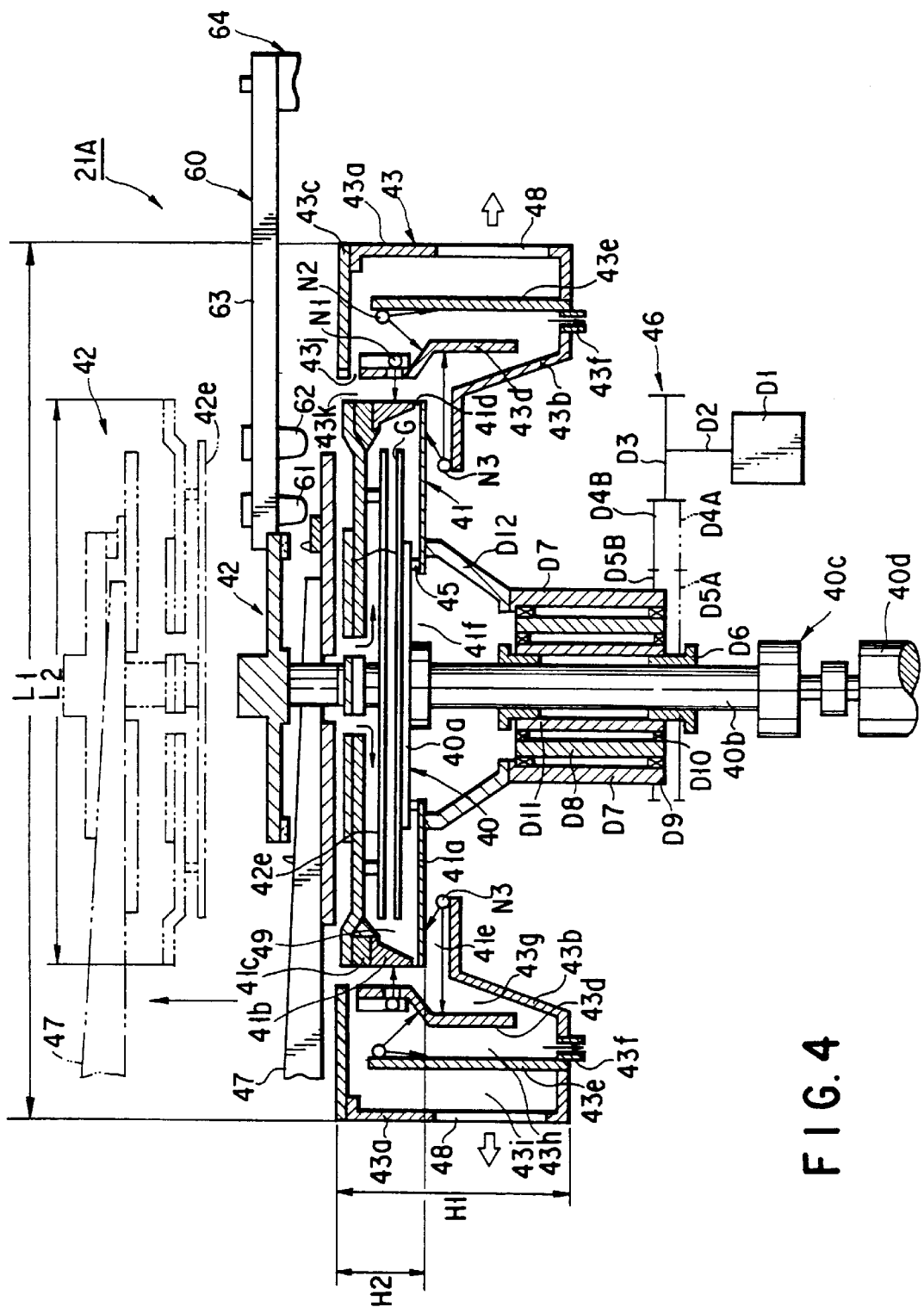
FIG. 4 is a sectional view, showing an essential part of a coating section.

As is shown in FIG. 4, the resist coating section 21A includes a spin chuck 40, a lid 42, a rotary cup 41 as an inner cup, a drain cup 43 as an outer cup, and a resist liquid supply mechanism 60. The spin chuck 40 has a vacuum mechanism 40c for holding the substrate G by a vacuum force, and a rotary driving mechanism 40d for rotating the substrate G. The rotary cup 41 surrounds the spin chuck 40. The drain cup 43 surrounds the rotary cup 41. The lid 42 is disposed to cover an upper opening of the rotary cup 41. A plurality of liquid exhaust pipes (drain pipes) 43f are attached to the bottom 43b of the drain cup 43 for exhausting mist and waste water therethrough into a collecting/recycling unit (not shown). The coating liquid supply mechanism 60 includes a solvent supply nozzle 61, a resist liquid supply nozzle 62, a horizontal arm 63 and a swaying mechanism 64. The two nozzles 61 and 62 are supported by the common horizontal arm 63. When the swaying mechanism 64 sways the horizontal arm 63 about the vertical axis, the nozzles 61 and 62 are reciprocated between their home positions and use positions.

As is shown in FIG. 3, the peripheral-resist-removing unit 21B has four solvent discharge nozzles 83, a scan driving mechanism 82 for moving the nozzles 83 along a guide rail 81, and a mount table 80 for securely holding the substrate G. Approach sensors 84 are provided for preventing interference of the nozzles 83 with each other. Further, a purification unit 93 and a reservoir tank 94 are provided as means for collecting and recycling a solvent (thinner). The purification unit 93 has a built-in filter for separating thinner from a suctioned exhausted substance. The reservoir tank 94 temporarily reserves thinner purified by the purification unit 93. The reservoir tank 94 contains a pump for supplying thinner to cleaning nozzles N1–N3 incorporated in the resist coating section 21A.

The nozzles N1–N3 are provided on appropriate inner surface portions of the drain cup 43. The nozzle N1 is used to jet thinner from an inner wall 43d of the drain cup 43 to the rotary cup 41, the nozzle N2 to jet thinner to the inner surface of an outer wall 43e and to the outer surface of the inner wall 43d, and the nozzle N3 to jet thinner to the outer lower surface of the rotary cup 41 and the inner surface of the inner wall 43d.

Each nozzle N1–N3 is supplied with thinner from the tank 94. As shown in FIG. 3, the tank 94 communicates via the purification or reproduction unit 93 with collecting lines 95 incorporated in the peripheral-resist-removing section 21B. The reproduction unit 93 has a suctioning function, a gas/liquid separating function and a solid/liquid separating function. As shown in FIG. 7, the collecting lines 95 open in the vicinity of the solvent supply nozzles 83. The reproduction unit 93 suctions and collects extra thinner and a dissolved substance from above the substrate G via the collecting lines 95, then separates thinner from the collected substance, purifies the separated thinner and supplies the purified thinner to the tank 94.

Referring then to FIGS. 4–10, the resist coating section 21A will be described in more detail.

The rotary shaft 40d of a driving mechanism 46 is connected to the lower surface of the spin chuck 40. The rotary shaft 40d is connected to a vertically movable cylinder 40b via a vacuum seal section 40c, and slidably supported by the lower end of the rotary cup 41 via a spline bearing D6.

A driven pulley D5A is mounted on the spline bearing D6, and a belt D4A is bridged between the driven pulley D5A and a driving pulley D3. The driving pulley D3 is attached to the driving shaft D2 of a motor D1. The spin chuck 40 is supported by the vertically movable cylinder 40d such that it can move vertically.

The rotary cup 41 is provided such that it surrounds the upper and outer portions of the spin chuck 40. A treatment chamber (treatment space) 49 is defined in the rotary cup 41 for treating the substrate G. An opening 41f is formed in a center portion of the lower surface 41a of the rotary cup 41, through which opening the spin chuck 40 is inserted into the treatment chamber 49.

The lower surface 41a of the rotary cup is coupled to the upper end of a rotary outer cylinder D7 via a coupling cylinder D12. The rotary outer cylinder D7 us coupled to a stationary color D8. The stationary color D8 is coupled to a rotary inner cylinder D11 via a bearing D10, and the rotary shaft 40b is coupled to the rotary inner cylinder D11 via the spline bearing D6. Moreover, a labyrinth seal (not shown) is provided between the opposed surfaces of the stationary color D8 and the rotary inner cylinder D11, and between the opposed surfaces of the stationary color D8 and the rotary outer cylinder D7. These labyrinth seals prevent particles having occurred in the driving mechanism located below, from entering the treatment space 49.

A driven pulley D5B is mounted on the rotary outer cylinder D7. The driven pulley D5B is disposed to receive a driving force from the driving pulley D3 of the motor D1 via a belt D4B. The driven pulley D5B has the same diameter as the driving pulley D5A, and they are driven by the same motor D1. Accordingly, the spin chuck 40 and the rotary cup 41 are synchronously rotated.

The rotary cup 41 itself is a flat cylindrical container with a bottom and an opening, has a size which enables accommodation of the substrate G, and can be rotated at high speed by the driving section 46. A bottom center portion of the rotary cup 41 is disposed to be closed by the spin chuck 40. The rotary cup 41 also has peripheral walls 41b and 41c whose inner surfaces are downwardly tapered. A plurality of exhaust holes 41d are formed in lower portions of the peripheral wall 41b of the cup 41 for exhausting liquid drips or mist therethrough into the drain cup 43.

As shown in FIG. 4, the upper opening of the rotary cup 41 is closed with the lid 42. The edge of the lid 42 tightly contacts the edge of the rotary cup 41 so that no outside air can enter the rotary cup 11 from the edge. Further, a plurality of air supply holes 42a are formed in the lid 42 in the vicinity of its center, through which outside air is introduced into the rotary cup 41.

A rectifying plate 42e is provided below the lid 42. Air is introduced into the treatment space 49 through the air supply holes 42a, then radially spreads along the rectifying plate 42e, and flows from the treatment space 49 to gas/liquid separating sections 43g, 43h, 43i through the exhaust holes 41d. The flow of air directed from the air supply holes 42a to the exhaust holes 41d enables prompt and smooth exhaustion of liquid drips and mist of a resist liquid from the treatment space 49. In addition, the air supply holes 42a and the exhaust holes 41d prevent the internal pressure of the rotary cup 41 from excessively decreasing, and therefore the lid 42 can be easily detached from the rotary cup 41.

Figure 9A:
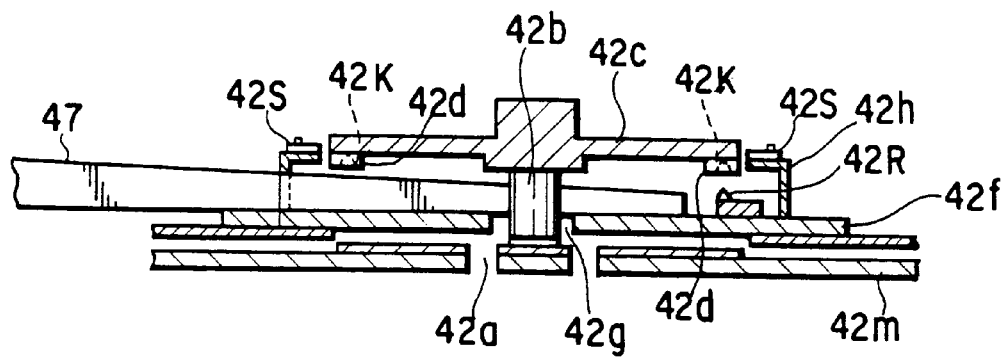
FIGS. 9A and 9B are sectional views, showing an interlock mechanism employed in a cup upper lid.
Figure 9B:
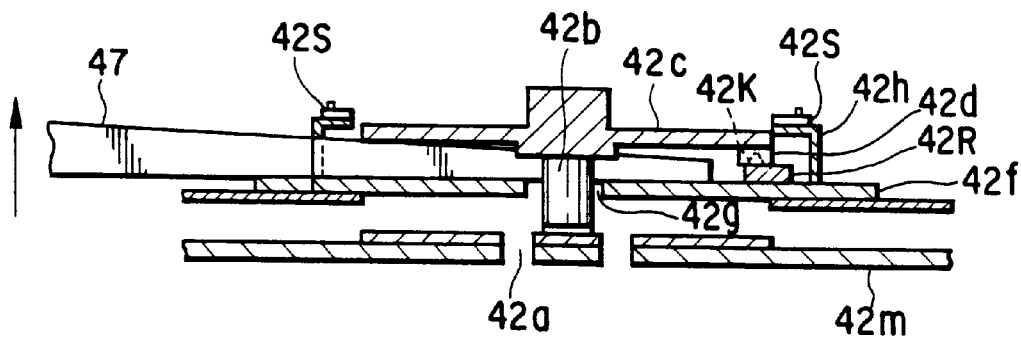

Referring then to FIGS. 9A and 9B, the lid 42 will be described.

A shaft 42b upwardly extends from a center portion of a lid main body 42m, and a head 42c is attached to the upper end of the shaft 42b. The head 42c is shaped like a disc, and three engagement members 42d are attached to edge portions of the lower surface of the head 42c. A recess 42K is formed in each engagement member 42d.

A movable bracket 42f is inserted between the lid main body 42m and the head 42c, and vertically movably supported by two horizontal arms 47. A loose hole 42g is formed in a center portion of the movable bracket 42f, through which the shaft 42b is inserted. Three lock pins 42R are attached to the upper surface of the movable bracket 42f. Each lock pin 42R is fitted in a corresponding one of the recesses 42K, thereby securing the movable bracket 42f to the lid main body 42m.

Further, three sensors 42S are attached to the upper surface of the movable bracket 42f by means of support members 42h. When the lid 42 has been mounted on the cup 41 (when the lid has been closed), each sensor 42S is opposed to a corresponding peripheral edge portion of the head 42c as shown in FIG. 9A. Each sensor 42S is constructed such that it emits horizontal sensing light to a side wall of the head 42c, and receives reflection light from the side wall. The three sensors 42S send signals to the controller 90, which in turn determines from the sensor signals whether or not the lid 42 is situated horizontal. In other words, if the lid 42 inclines or displaces while mounted on the rotary cup 41, the controller 90 determines on the basis of the treatment conditions whether or not each treatment should be stopped, thereby controlling each treatment section, and supplying an abnormality signal to a warning device (not shown) to operate it. Thus, accidents can be prevented. Since in the state shown in FIG. 9A, the lock pings 42R are disengaged from the engagement members 42d, the lid main body 42m can be rotated together with the cup 41, with the movable bracket 42f and the support arms 47 stopped.

On the other hand, when the lid 42 has been raised from the cup 41 (when the lid 42 has been opened), the lock pins 42R are fitted in the recesses 42K, thereby securing the movable bracket 42f to the lid main body 42m. The alignment of the lock pins 42R and the recesses 42K is performed by rotation angle control using the servo motor D1. The lid 42 and the cups 41 and 43 are made of anti-corrosion metallic materials. For example, the lid is made of aluminum, and the cups 42 and 43 are made of stainless steel.

The drain cup 43 is ring-shaped, and disposed to receive drain water or mist exhausted from the rotary cup 41, separate their mixture into a gas and a liquid, and exhaust each component into a drain unit (not shown), an exhaust device 91 or a reproduction unit (not shown).

Figure 6:
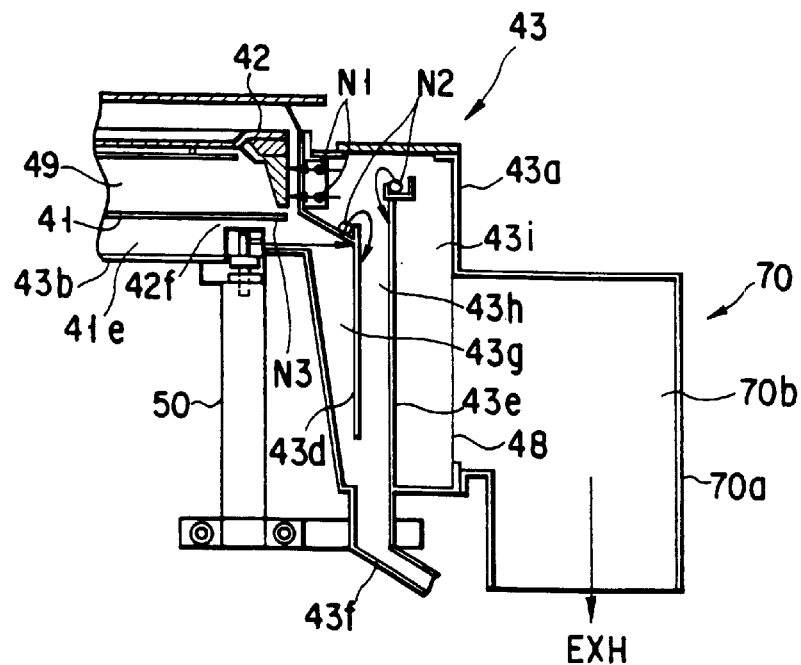
FIG. 6 is a partially expanded sectional view, showing part of the cup of FIG. 5.

As is shown in FIGS. 4 and 6, annular gas/liquid separation passages 43g, 43h and 43i are formed in the drain cup 43. The separation passages 43g, 43h and 43i are defined like a labyrinth by the drain cup bottom 43b, the drain cup ceiling 43c and two vertical walls 43c and 43e. The one vertical wall 43d downwardly extends from the drain cup ceiling 43c, and has its lower end separated from the drain cup bottom 43b. The other vertical wall 43e stands from the drain cup bottom 43b and has its upper end separated from the drain cup ceiling 43c. A plurality of exhaust ports 43f are formed in the bottom 43d between the walls 43d and 43e. Further, an exhaust passage 43j is formed in an upper end portion of the inner vertical wall 43d for suppressing raising of mist in the drain cup 43 by the flow from the exhaust passage 43j.

The size of each component of the coating section 21A corresponding to the substrate G of 830×650 mm will be specified. The outer diameter L1 of the drain cup 43 is about 1300 mm. The height H1 of the drain cup 43 is about 220 mm. The outer diameter L2 of the lid 42 and the rotary cup (inner cup) 41 is about 1100 mm. The height H2 of the rotary cup 41 is about 40 mm.

Figure 5:
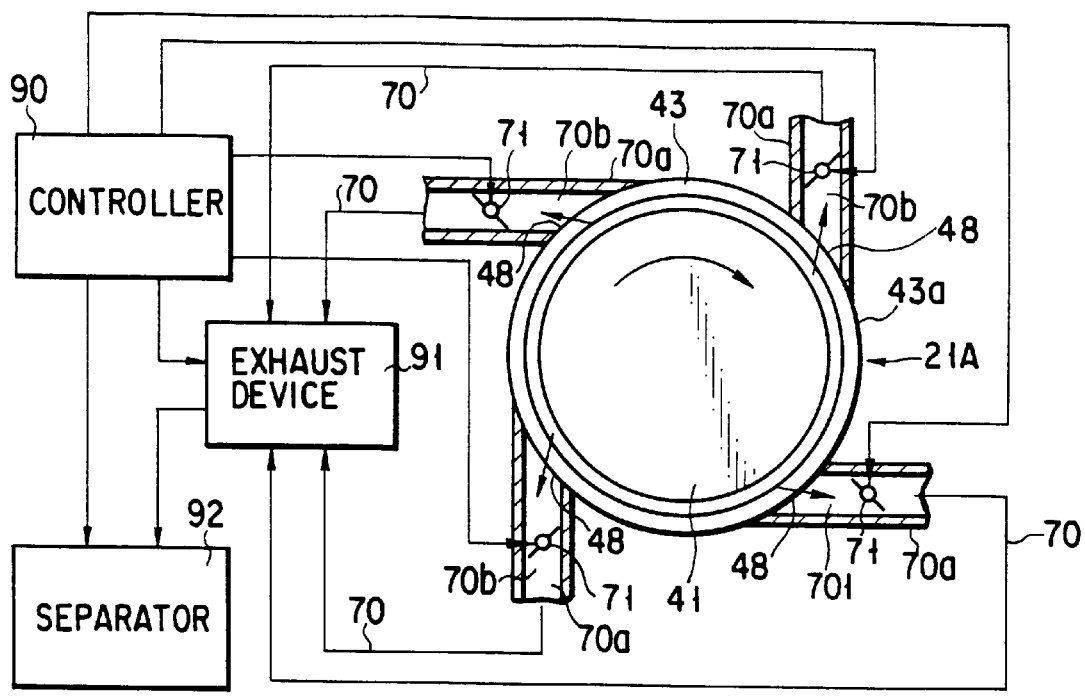
FIG. 5 is a plan block diagram, showing a cup exhaust mechanism.

As is shown in FIG. 5, four exhaust ports 48 open to the outer peripheral wall 43a of the drain cup such that they communicate with the suction-side of the exhaust device 91 through exhaust lines 70. A damper 71 is provided across a flow passage 70b formed in an exhaust pipe 70a which constitutes each exhaust line 70. The power switch of a driving unit for driving each damper 71 is connected to the output side of the controller 90, so that the opening of the damper 71 can be adjusted depending upon the kind of treatment. The exhaust device 91 communicates with a separator 92. The separator 92 separates and extracts an effective component from a suctioned exhausted substance. Part of mist of the resist liquid is liquidized in the gas/liquid separation passages 43g, 43h and 43i of the drain cup 43, and the other part of the mist is exhausted from the drain cup 43 via the exhaust ports 48 into the passages 70b of the exhaust pipes 70a. Then, the mist is separated into a gas and a liquid by the separator 92, whereby only an effective component is seized. A reproduction unit (not shown) may be provided for reusing the extracted effective component.

Referring to FIGS. 5 and 6, the exhaustion performed in the drain cup will be described in more detail.

When the resist liquid has been applied to the substrate G, and the spin chuck 40 and the rotary cup 41 have been rotated synchronously, the resist liquid is separated from the substrate G and a great amount of fine liquid particles (i.e. mist) is generated. This mist is gushed from the rotary cup 41 via the exhaust holes 41d into the drain cup 43. Since the speed of the mist reaches a very high value, it is liable to directly flows into the exhaust passage via the exhaust ports 48. Since, in particular, a large centrifugal force acts upon the mist in the case of a large substrate G, the mist directly flows into the exhaust passage, with the result that the mist concentration is low at areas in front of the exhaust ports 48, and high at areas around the exhaust ports 48. After the rotation of the substrate G is stopped, mist of high concentration remains at the areas around the exhaust ports 48.

To uniformly and promptly exhaust the mist from all internal areas of the drain cup 43, the exhaust pipes 70a are attached to the drain cup 43 in particular directions. Specifically, as shown in FIG. 5, the four exhaust pipes 48 open to the outer periphery 43a of the drain cup 43 at regular intervals, the passage 70b of each exhaust pipe 70a communicates with a corresponding exhaust port 48, and the exhaust passages 70b are directed outward and opposite to the direction of rotation of the rotary cup 41 (i.e. the direction of rotation of the substrate G). In other words, the exhaust pipes 70a are attached to the outer peripheral wall 43a of the drain cup 43 so that they can take in exhausted substances in a direction opposite to the direction of rotation of the rotary cup 41. This structure of the exhaust passages 70b significantly enhances the gas/liquid separation efficiency in the interior of the drain cup 43, thereby effectively preventing direct flow of mist into the exhaust passages 70a.

The transversal cross section of each exhaust passage 70b is approximately completely round, and the exhaust pipes 70a are attached along tangent lines of the cup outer periphery 43a. Therefore, the exhaust ports 48 are substantially elliptical. It is preferable that the major and minor axes of each elliptical exhaust port 48 should be about 200–300 mm and 80–100 mm, respectively. Attachment of such exhaust pipes 70a to the drain cup 43 increases the opening amount and hence enables exhaustion of a wide range in the drain cup 43. As a result, the drain cup 43 can be exhausted promptly, which means that mist can be promptly discharged from the rotary cup 41.

As is shown in FIG. 6, the drain cup 43 of the embodiment has a depth H1 which is greater by a value corresponding to the height of the outer peripheral wall 43a, than in the conventional case. Thus making the depth of the drain cup 43 greater by H1 enables expansion of the passage for the mist, thereby further accelerating the gas/liquid separation in the drain cup 43. More specifically, the exhaust port 48 opens at a lower portion of the last one 43j of the gas/liquid separation passages in the drain cup 43, such that the upper end of the exhaust pipe 70a is situated at a level lower than the upper end 43c of the drain cup 43 (i.e. the exhaust passage has a step). Accordingly, the mist lowers along the inner wall 43d, rises along the outer wall 43e, and once bumps against the outer peripheral wall 43a while passing an upper portion of the passage 43j. This means that the mist will not enter the exhaust passage 70b directly from the upper portion of the passage 43j. Even when the mist has bumps against the outer peripheral wall 43a, its gas/liquid separation is promoted, which further reduces the amount-of the mist which directly enters the exhaust passage 70b without being separated into a gas and a liquid.

FIG. 7 is a schematic view of the resist coating section 21A and the peripheral-resist-removing section 21B, useful in explaining the exhaustion performed in these sections. The resist coating section 21A has four unit exhaust pipes 70, while the peripheral-resist-removing section 21B has four unit exhaust pipes 95. The resist coating section 21A and the peripheral-resist-removing section 21B are exhausted by the unit exhaust pipes 70 and 95 so as not to keep evaporized solvent (thinner) remained in the unit 21.

Referring back to FIG. 6, the drain cup bottom 43b extends below the outer periphery of the rotary cup 41, and a clearance 41e exists between them which are out of contact with each other. An adjusting mechanism 50 is attached as shown in FIG. 6 so that mist will not enter the driving mechanism 46 through the clearance 41e. Specifically, the adjusting mechanism 50 is attached such that its upper end 50e is opposed to the bottom of the rotary cup 41, thereby forming therebetween a clearance 42f narrower than the clearance 41e. It is desirable that the clearance 42f should be set at a few milimeters.

Figure 10:
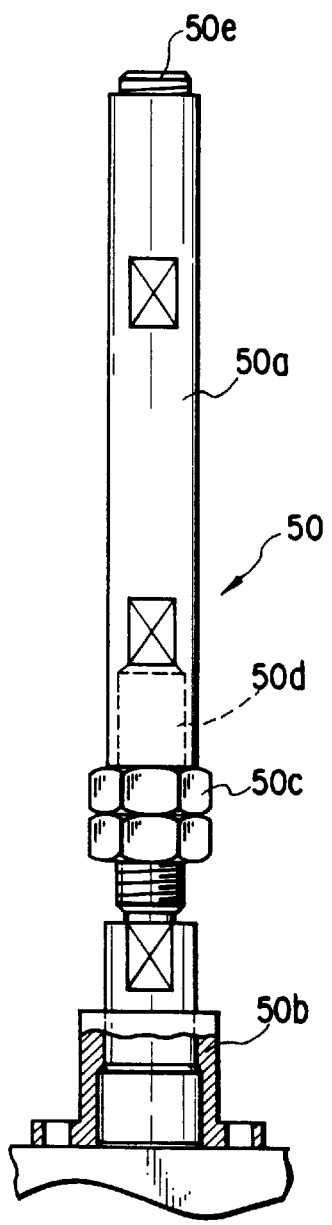
FIG. 10 is a sectional view, showing an adjusting mechanism for adjusting the clearance between a rotary cup and a drain cup.

Referring to FIG. 10, the adjusting mechanism 50 has an upper column 50a, a lower base 50b, and a bolt 50c and a nut 50d interposed between the column 50a and the base 50b. When the bolt 50c is rotated relative to the upper column 50a, the height of the upper column 50a changes. This can reduce the clearance 42f to a maximum degree, with the upper end 50e kept out of contact with the rotary cup 41. The larger the substrate G, the more necessary the adjusting mechanism 50. In the conventional case, the clearance is narrowed by inserting a member such as a washer. As compared with this, the adjusting mechanism 50 of the present invention can more easily adjust the clearance.

Figure 11:
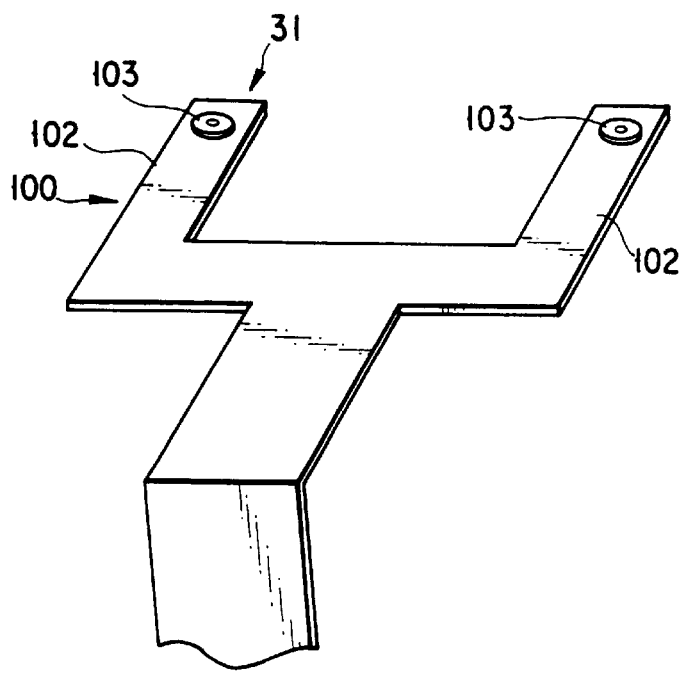
FIG. 11 is a perspective view, showing a carrier for transferring a substrate from the coating section to the peripheral coating removing section.
Figure 12:
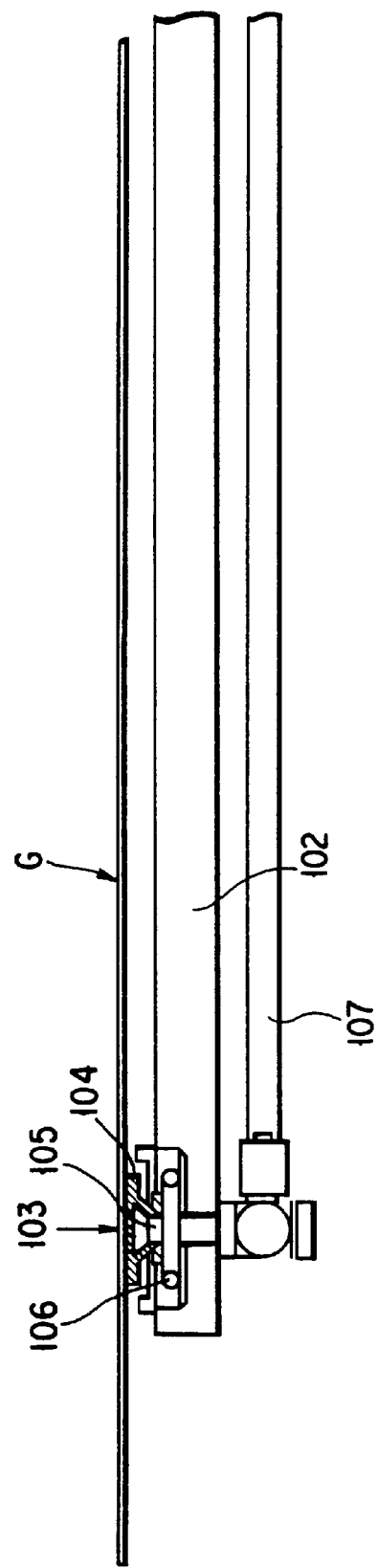
FIG. 12 is a sectional view, showing a state in which the carrier supports a substrate.
Figure 13:
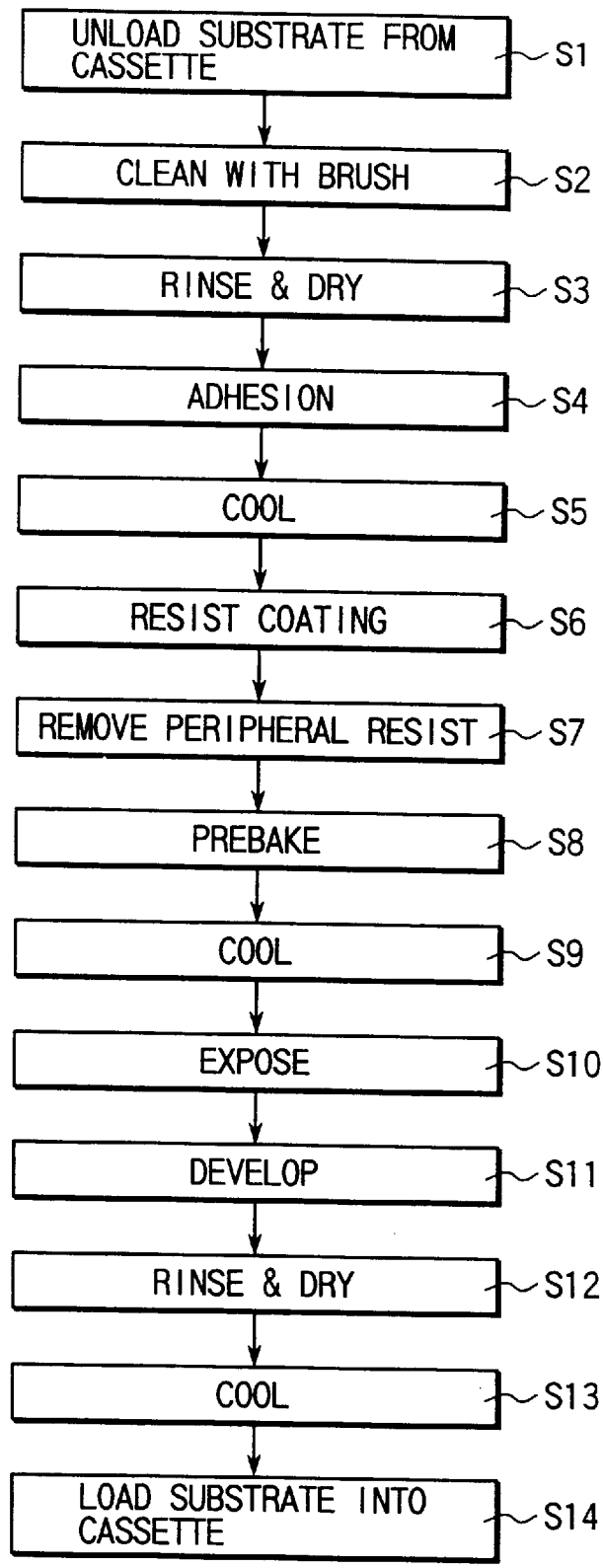
FIG. 13 is a flowchart, useful in explaining a series of resist treatment steps.

Referring then to FIG. 11, the conveying mechanism 100 has a pair of arms 102. A chuck 103 is attached to a dismal end portion of each arm 102 for holding the substrate G by a vacuum force. As is shown in FIG. 12, the chuck 103 includes a top pad 104, a vacuum hole 105 and a packing 106. The top pad 104 has a downwardly tapered suction hole communicating with the vacuum hole 105. The vacuum hole 105 further communicates with the passage of a pipe 107. Edge portions of the reverse surface of the substrate G are held by the chucks 103 by a vacuum force, whereby the substrate is reliably held. To prevent an intermediate portion of a large substrate G from being bent, an intermediate support member 108 is attached to an appropriate portion of each arm 102 for supporting the intermediate portion of the substrate.

Referring now to FIGS. 13–20, a series of resist treating steps for the LCD substrate G will be described.

First, a single substrate G is taken out of the cassette C1 by means of the sub transfer arm 13 (step S1). The sub arm 13 transfers the substrate G onto the first main transfer arm 14A, which in turn transfers it to the brush cleaning unit 16 to subject to scrubbing cleaning (step S2). Subsequently, the substrate G is rinsed using pure water and dried by heating (step S3).

After that, the first main transfer arm 14A transfers the substrate G into the adhesion unit 24, where vapor of HMDS is applied to the substrate G while heating it, thereby imparting a hydrophobic property to it (step S4). Then, the first main transfer arm 14A transfers the substrate G to the second main transfer arm 14B, which in turn transfers it into the cooling unit 25 to cool it (step S5).

The second main transfer arm 14B takes the substrate G out of the cooling unit 20 and transfers it into the unit 21. When the second main transfer arm 14B has arrived in front of the resist coating section 21A, it opens a shutter (not shown) and transfers the substrate G is into the resist coating section 21A.

Then, the lid 42 is opened, the spin chuck 40 is raised, and the substrate G is transferred from the arm holder 14b of the second main arm mechanism 14B onto the spin chuck 40. The arm holder 14b is retreated and the shutter is closed. The substrate G is held on the spin chuck 40 by a vacuum force, and the spin chuck 40 is lowered (step S611).

Thereafter, the coating liquid supply mechanism 60 is moved from its home position to its use position, and the nozzle 61 is situated just above the center of the substrate G. While the substrate G is rotated at low speed, a solvent (e.g. ECA=ethyl cellosolve acetate) is applied to the substrate C through the nozzle 61 (step S612). Then, the lid 42 is closed (step S613) and the rotary cup 41 is rotated in synchronism with the rotation of the substrate G (step S614).

After that, the lid 42 is opened, the nozzle 62 is situated just above the center of the substrate G, and a resist liquid is applied from the nozzle 62 onto the substrate G. The lid 42 is again closed, exhaustion of the drain cup 43 is started, and the rotation of the rotary cup 41 and the substrate G is started.

Figure 14:
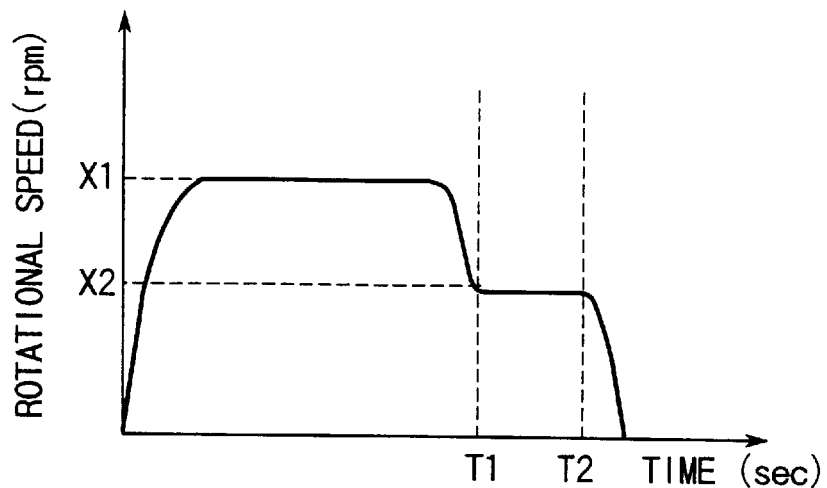
FIG. 14 is a graph, showing the relationship between a treatment time and the rotational speed of an LCD substrate.

FIG. 14 is a graph, showing the history of the rotational speed of the substrate during the resist coating treatment. In this figure, the abscissa indicates the time (second) which has elapsed after the start of the rotation of the substrate G, and the ordinate the rotational speed (rpm) of the substrate G. For a period from a time at which a predetermined rotational speed X1 is reached after the start of the rotation, to a time T1, the substrate G is kept at a predetermined rotational speed X1 (step S614). During the period from the start of the rotation to the predetermined time T1, a resist film of a uniform thickness is formed on the substrate G (step S615). After the predetermined time T1, an instruction signal is supplied from the controller 90 to the power circuit of the driving motor D1, thereby decelerating the rotational speed of the spin chuck 40 from X1 to X2 (step S616). As a result, the resist film is more stabilized than when the rotational speed is X1. After that, until the termination of the coating treatment, the rotational speed of the substrate G is kept at the speed X2.

Figure 17:
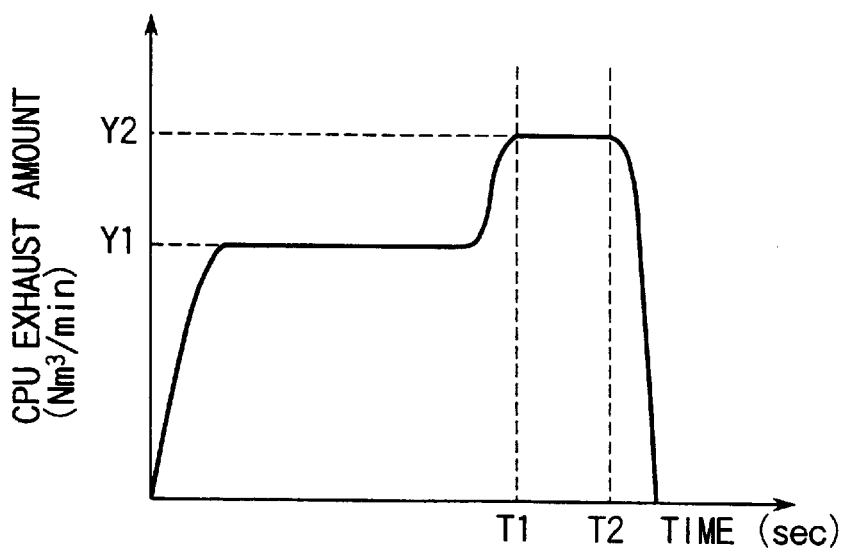
FIG. 17 is a graph, illustrating the relationship between a treatment time and a cup exhaustion amount.
Figure 15:
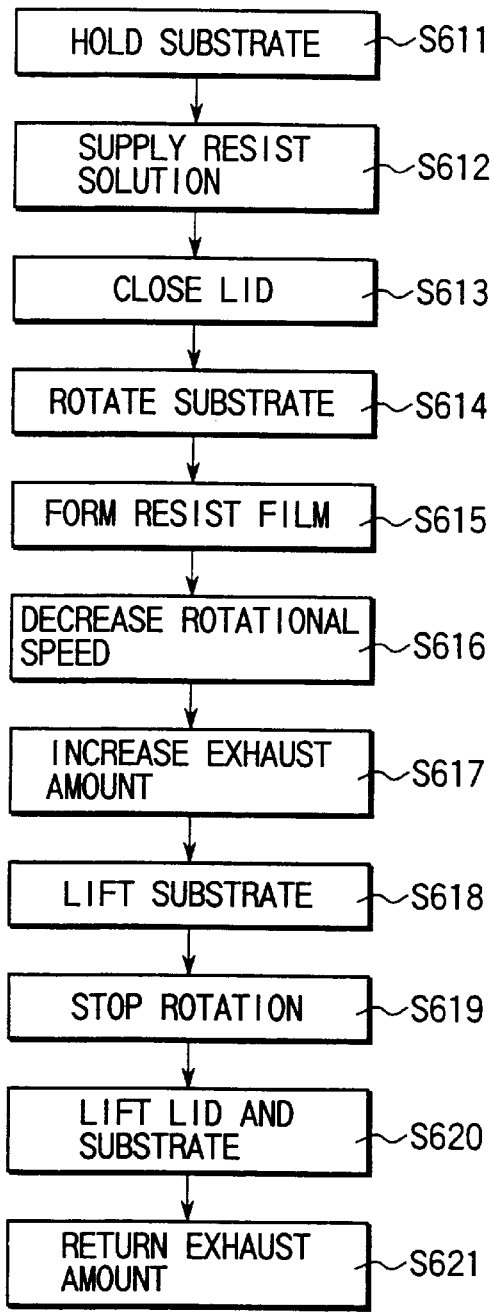
FIG. 15 is a flowchart, useful in explaining a substrate treatment process according to an embodiment of the invention.

FIG. 17 is a graph, showing the history of the cup exhaust amount during the resist coating treatment. In this figure, the abscissa indicates the time (second) which has elapsed after the start of exhaustion in the drain cup, and the ordinate the cup exhaust amount ($Nm^3$/min). The "cup exhaust amount" indicates the total amount of exhaustion at the four exhaust ports 48. During the period from the start of exhaustion to the time T1, the exhaust amount is kept at a predetermined value Y1 (step S612–S616). After the time T1, an instruction signal is supplied from the controller 90 to the power circuit of the exhaust device 91 and the power circuit of the damper 71, thereby increasing the cup exhaust amount from Y1 to Y2 (step S617). After that, until the termination of the coating treatment, the cup exhaust amount is kept at Y2.

Thus increasing the cup exhaust amount to Y2 increases the exhausting function of the treatment chamber 49, thereby enabling uniform and prompt exhaustion of mist from the cups 41 and 43. Moreover, since in the process step for uniforming the thickness of the resist film, the cup exhaust amount is suppressed at Y1 in the initial stage, and increased to Y2 in the later stage, the step of forming a resist film of a uniform thickness will not adversely be affected. In addition, since the rotational speed of the spin chuck 40 is decelerated while the cup exhaust amount is increased, the thickness of the resist film can be further uniformed.

Figure 16:
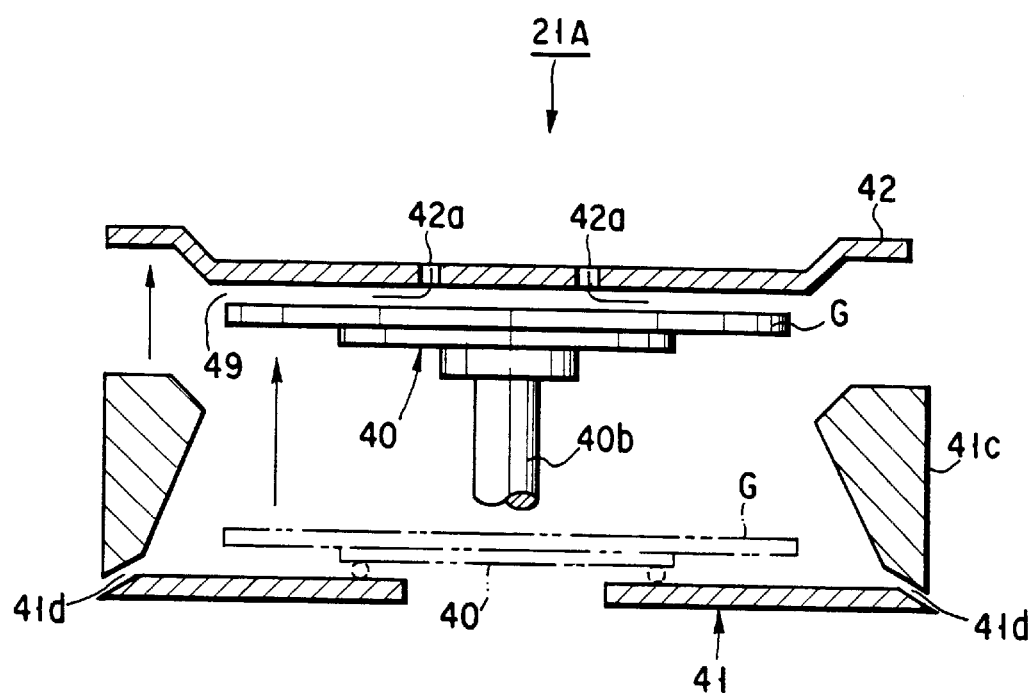
FIG. 16 is a sectional view, useful in explaining the movement of the lid and the LCD substrate.
Figure 19:
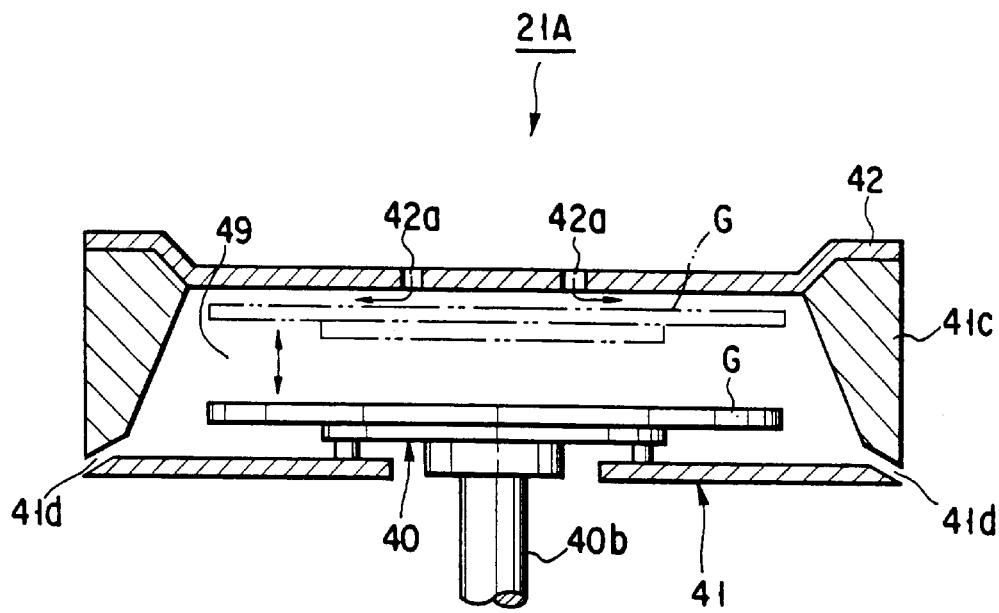
FIG. 19 is a view, useful in explaining the movement of the LCD substrate within the cup.

Moreover, as shown in FIG. 19, the rotating substrate G is raised within the treatment chamber 49 to cause it to approach the lid 42 such that it is opposed to the lid at a level higher than the exhaust port (step S618). Thus narrowing the space between the lid and the substrate G enables gas flow from a center portion of the substrate G toward a peripheral portion thereof, thereby preventing mist from flowing into the space from the peripheral side. As a result, the amount of mist attached to the substrate can be reduced. After a predetermined time T2 has elapsed from the start of the coating treatment, the rotation of the substrate G is stopped as shown in FIG. 14 (step S619). Then, as shown in FIG. 16, the lid 42 and the substrate G are raised (step S620). In this case, it is preferable that the raising speed of the substrate G is greater than that of the lid 42 in the step S620. Thus narrowing the space between the lid and the substrate G enables gas flow from a center portion of the substrate G toward a peripheral portion thereof, thereby preventing mist from flowing into the space from the peripheral side. As a result, the amount of mist attached to the substrate can be reduced. The substrate G may not be raised while it rotates, but only after its rotation stops. Since the mist is sufficiently exhausted from the treatment chamber 49 by the predetermined time T1 or T2, only a small amount of floating mist remains in the treatment chamber 49. Accordingly, it is hard for the mist to stick to the resist coating, thereby significantly increasing the yield of products. Further, since almost no gas flow occurs around the substrate G as a result of synchronous rotation of the rotary cup and the substrate, a resist coating of a uniform thickness can be formed.

The time point of deceleration of the substrate's rotational speed may not necessarily be the same as that of increasing the cup exhaust amount. The cup exhaust amount may be increased after the rotational speed of the substrate G is reduced depending upon the kind of treatment, or vice versa. Moreover, it is not always necessary to set the rotational speed of the substrate G constant in the initial stage. The rotational speed may be changed depending upon the kind of treatment. Similarly, the cup exhaust amount may be changed depending upon the kind of treatment.

After the resist coating treatment, the lid 42 is opened, the spin chuck 40 is raised, and the substrate G is transferred to the peripheral-resist-removing section 21B by the conveying mechanism 100. When the substrate G has been moved into the section 21B, the mount table 80 is raised to receive the substrate G thereon from the conveying mechanism 100. After that, the conveying mechanism 100 is retreated and the mount table 80 is lowered.

Each nozzle 83 is made to discharge thinner to the substrate G while being moved along the four sides of the substrate G, thereby removing the resist coating from a peripheral portion of the substrate G (step S7). The mount table 80 is raised to transfer the substrate G therefrom to the second main transfer arm 14B. The arm 14B conveys the substrates G out of the unit 21.

The second main transfer arm 14B conveys the substrate G into the baking unit 26, where the substrate is heated to evaporate a solvent from the resist coating (step S8). Then, the substrate G is transferred into the cooling unit 27, where it is cooled (step S9). Subsequently, the substrate G is conveyed into the exposure unit 6 via the interface section 7, where the resist coating on the substrate is subjected to pattern exposure (step S10).

After the exposure treatment, the substrate G is moved into the developing unit 28, where the exposed resist coating is developed (step S11). The substrate G is then rinsed by pure water and dried by heating (step S12). Then, the substrate G is moved into the cooling unit 33, where it is cooled (step S13). The treated substrate G is transferred to the first through third main transfer arms 14A–14C and the sub transfer arm 13. The substrate is then transferred to the cassette C2 of the loader section 2 by the sub transfer arm 13, and accommodated therein (step S14). Finally, the cassette C2 full of substrates G is shifted from the system 1 to a treatment unit of the next stage.

Figure 18:
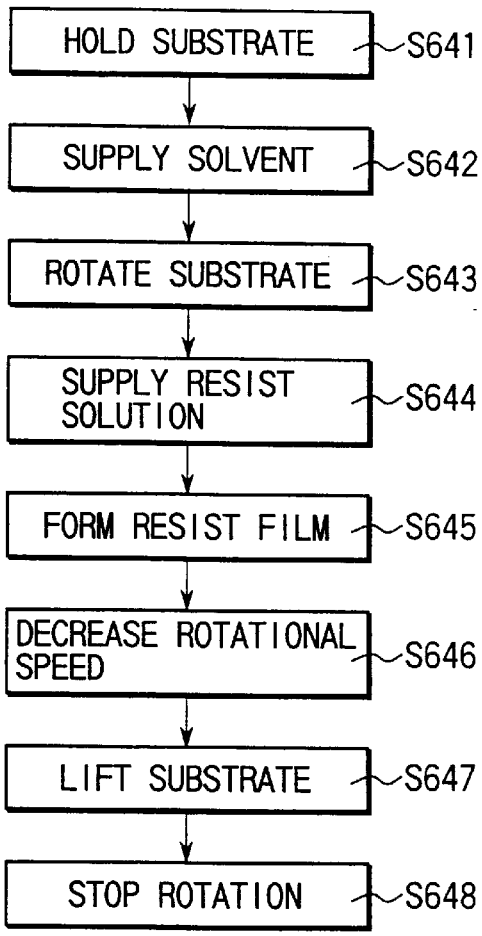
FIG. 18 is a flowchart, illustrating a substrate treatment process according to another embodiment of the invention.
Figure 20:
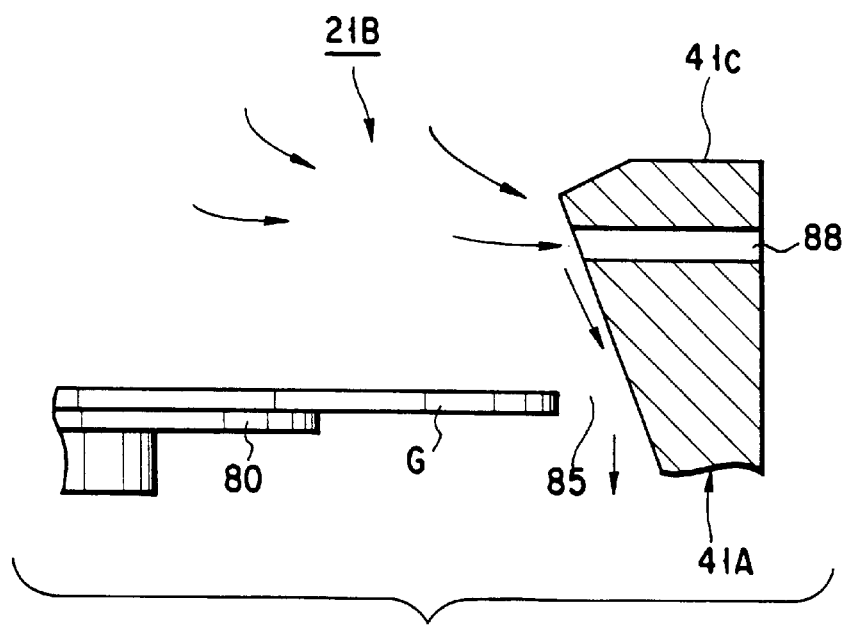
FIG. 20 is an enlarged sectional view, showing an essential part of a substrate treatment apparatus according to a further embodiment of the invention.

Referring then to FIGS. 18–20, another embodiment of the invention will be described. No description will be given of the elements of this embodiment which are similar to those of the above embodiment.

Steps S641, S644 and S645 of the flowchart of FIG. 18 are substantially similar to the steps employed in the above embodiment. In this embodiment, however, a solvent is applied to the substrate G with the lid 42 opened (step S642), and the substrate G is rotated (step S643), thereby causing the upper surface of the substrate G to get wet. After the pre-wet operation of the solvent, a resist liquid is applied to the substrate G (step S644), and the substrate G is rotated with the lid 42 kept open, thereby forming a resist coating thereon (step S645) and reducing the rotational speed of the substrate G as shown in FIG. 14 (step S646). At a step S647, the substrate G coated with the resist coating is raised within the rotary cup 41 as shown in FIG. 18. The higher portion of the treatment space 49, the smaller the amount of mist. Therefore, adhesion of mist to the resist coating of the substrate G can be effectively prevented even after the rotation of the substrate G is stopped. Furthermore, since flow of pure air introduced through the air supply holes 42a of the lid 42 protects the resist coating, the resist coating can be further protected from contamination by the mist. The rotation of the substrate G is stopped (step S648). After the coating treatment is thus finished, the substrate G is transferred to the peripheral-resist-removing section 21B by the conveying mechanism 100. It may be constructed such that the exhaust amount at the above steps S641–S648 is kept constant, or it may be increased at a later stage of the resist forming process or after the process.

As is shown in FIG. 20, an exhaust hole 88 may be also formed in an upper portion of a rotary cup 41A, through which hole the rotary cup 41A is exhausted. More specifically, a liquid component is exhausted from the rotary cup 41A through the lower exhaust holes 41d, and a gas component is exhausted therefrom through the upper exhaust holes 88. As a result, the mist can promptly be also exhausted from the rotary cup 41A.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating apparatus comprising:

a spin chuck for rotatably holding a substrate;

a nozzle for supplying a coating liquid to the substrate held by the spin chuck;

a rotary cup surrounding the substrate held by the spin chuck, and having an exhaust hole for discharging that part of the coating liquid which has separated and spattered from the substrate while the substrate rotates;

a drain cup surrounding the rotary cup, the drain cup having a drainage port formed in a bottom portion thereof for discharging a liquid, a plurality of exhaust ports formed in a circumferential portion of the drain cup for discharging a gas, and a gas/liquid separation passage extending in a zigzag manner between each of the exhaust ports and the exhaust hole; and an exhaust pipe having a flow passage communicating with each of the exhaust ports, the flow passage outwardly projecting from an outer periphery of the drain cup, so as to guide the coating liquid in the form of mist in a direction opposite to a direction of rotation of the substrate along a tangent line of a rotation circle of the substrate.

2. A coating apparatus according to claim 1, wherein each of the exhaust ports opens at a lower circumferential portion of the drain cup, and the circumferential portion of the drain cup constitutes part of the gas/liquid separation passage.

3. A coating apparatus according to claim 1, further comprising means for rotating the rotary cup in synchronism with the substrate.

4. A coating apparatus according to claim 1, wherein the drain cup is ring-shaped, and the exhaust pipes substantially circumscribe the circumferential portion of the drain cup.

5. A coating apparatus according to claim 1, further comprising a clearance adjusting mechanism having a projection projecting toward a lower edge portion of the rotary cup, the clearance adjusting mechanism adjusting a clearance defined between the projection and the rotary cup.

6. A coating apparatus according to claim 5, wherein the clearance adjusting mechanism includes:

a stationary section attached to the drain cup;

a movable stick member supported by the stationary section; and screw forwarding means for raising the movable stick member such that an upper end thereof is opposed to and not in contact with the rotary cup.

7. A coating apparatus according to claim 1, further comprising:

a lid detachably attached to the rotary cup;

a horizontal arm supporting the lid; and lid driving means for movably supporting the horizontal arm.

8. A coating apparatus according to claim 7, wherein the lid includes:

a lid main body for closing an upper opening of the rotary cup and rotating together with the rotary cup when coating the substrate with the coating liquid;

a shaft coupled to the lid main body such that it projects upward from a central portion of the lid main body;

a head attached to an upper portion of the shaft;

an engagement member attached to a lower edge of the head and having a recess;

a movable bracket coupled to the horizontal arm and having a loose hole formed therein, through which the shaft is inserted such that the lid main body and the horizontal arm do not interfere with each other;

a lock pin attached to the movable bracket such that a sensor for sensing the recess of the engagement member; and rotation angle control means for controlling a rotation angle of the rotary cup on the basis of a position of the recess detected by the sensor, thereby enabling engagement of the lock pin with the recess.

9. A coating apparatus according to claim 8, further comprising a plurality of interlocking sensors provided on the movable bracket for sensing misalignment of the lid and the rotary cup.

10. A coating apparatus according to claim 1, wherein each of the exhaust ports has a dimension of 200–300 mm along the circumferential portion of the drain cup and a dimension of 80–100 mm along an axis of the drain cup.

* * * * *